United States Patent [19]

Dara

[11] Patent Number: 5,184,350
[45] Date of Patent: Feb. 2, 1993

[54] TELEPHONE COMMUNICATION SYSTEM HAVING AN ENHANCED TIMING CIRCUIT

[75] Inventor: Paul S. Dara, Broken Arrow, Okla.

[73] Assignee: Raytheon Company, Lexington, Mass.

[21] Appl. No.: 686,645

[22] Filed: Apr. 17, 1991

[51] Int. Cl.$^5$ .............................................. H04J 3/06
[52] U.S. Cl. .................................. 370/105.3; 375/120; 331/49
[58] Field of Search ......................... 370/105.3, 13, 16; 375/119, 120; 331/49; 371/8.1, 8.2, 11.1, 11.2

[56] References Cited

U.S. PATENT DOCUMENTS

| | | | |
|---|---|---|---|
| 4,148,184 | 4/1979 | Akahane et al. | 331/49 |
| 4,682,327 | 7/1987 | Okumura et al. | 370/105.3 |
| 4,803,705 | 2/1989 | Gillingham et al. | 370/105.3 |
| 4,949,052 | 8/1990 | Chigira | 331/49 |
| 5,052,028 | 9/1991 | Zwack | 331/49 |
| 5,142,247 | 8/1982 | Lada, Jr. et al. | 331/49 |

Primary Examiner—Douglas W. Olms
Assistant Examiner—Shick Hom
Attorney, Agent, or Firm—Judith A. Caplan; Richard M. Sharkansky

[57] ABSTRACT

A phase-locked loop circuit for monitoring electrical signals adapted for use in telephone communication systems. Clock signals synthesized by a first phase-locked loop circuit are monitored by a second phase-locked loop circuit. The second phase-locked loop circuit additionally provides clock signal synthesis redundancy and and monitors the functional status of the first, signal synthesizing phase-locked loop circuit.

17 Claims, 2 Drawing Sheets

TELEPHONE COMMUNICATION SYSTEM HAVING AN ENHANCED TIMING CIRCUIT

BACKGROUND OF THE INVENTION

This invention relates generally to telephone communication systems and more particularly to circuitry for synthesizing and monitoring clock signals for use in such systems.

As is known in the art, telephone communication systems currently operate in a variety of formats, such as T1 format (North American format) or Conference of European Postal and Telecommunications Administration (CEPT) format (European format). These formats indicate, inter alia, the frequency at which voice and/or data information is transmitted. For example, in CEPT telecommunication systems, the transmission frequency is 2.048 MHz; whereas, T1 transmission occurs at a frequency of 1.544 MHz.

As is also known in the art, in such telephone communication systems, often a reference clock signal is used to synthesize additional clock signals having frequencies which are integer multiples of the frequency of the reference clock signal. For example, in a T1 format telephone communication system, conventionally an 8 KHz reference clock signal provides the sampling rate for voice and/or data sampling and feeds a clock signal synthesizing circuit, such circuit synthesizing additional clock signals, or frequency synthesized output signals, having frequencies such as 64 KHz and 1.544 MHz, for example, for use in other parts of the system.

One method known in the art for generating a plurality of frequency synthesized signals, having frequencies which are integer multiples of the frequency of a reference clock signal, is to use a phase-locked loop circuit and a divider circuit. More particularly, the phase-locked loop circuit provides, at an output thereof, a signal which has a known phase relationship relative to the reference clock signal fed thereto. The output of the phase-locked loop circuit is, generally, fed to a divider circuit having a plurality of internal dividers corresponding to different divisor factors. The plurality of frequency synthesized output signals are, thus, provided at a plurality of outputs of the divider circuit.

As is also known in the art, it is often desirable to monitor a characteristic of an electrical signal. For example, it may be desirable to monitor a characteristic of the reference clock signal fed to a frequency synthesizing circuit, or of a frequency synthesized output signal. One method known in the art for monitoring the presence or absence of a signal is to use a comparator circuit. This type of circuit compares a fixed reference, or threshold level voltage with the voltage of a monitored signal and provides a logic signal output representative of the relative levels of the voltages being compared. More particularly, a comparator circuit indicates whether the voltage level of the monitored electrical signal is above or below that of the fixed reference, or threshold level voltage. Thus, in such an application, the comparator circuit is used to indicate whether the monitored signal is present (i.e. for example, when the voltage of the monitored signal is greater than the voltage of the fixed reference, or threshold level voltage) or absent (i.e. for example, when the voltage of the monitored signal is less than the voltage of the threshold level voltage). Such a comparator circuit may be adequate in certain applications, however, it is often desirable to monitor the frequency characteristic of an electrical signal in order to determine whether the signal has drifted away from its nominal frequency or whether, due to a failure in the circuitry, the frequency of the electrical signal is different than the desired frequency.

Two typical sources of error associated with a frequency synthesizing circuit are an error in the frequency of the reference clock signal or an error, or failure, in the operation of the circuit itself (i.e. either the phase-locked loop circuit or the divider circuit). An error in the frequency of the reference clock signal can be detected by monitoring the frequency of such signal; whereas, an error in the operation of the signal synthesizing circuitry manifests itself as an error in the frequency of the synthesized output signals and, thus, can be detected by monitoring the frequency of such signals.

One method known in the art for monitoring the frequency of a reference clock signal is to utilize, in generating the frequency synthesized output signals, a phase-locked loop circuit having a lock detection feature. An example of such a phase-locked loop circuit is Part No. 74HC7046 manufactured by RCA Corporation, Solid State Division of Somerville, N.J. Such a phase-locked loop circuit provides a logic signal indicating the presence or absence of an error in the frequency of the reference clock signal fed thereto. This feature is particularly desirable, in applications, in which an alternate, or secondary, reference clock signal is available for coupling to the clock signal synthesizing circuit in the event that an error is detected in the original, or primary, reference clock signal itself. In other words, it is desirable to ensure the accuracy of the alternate reference clock signal prior to coupling such alternate signal to the clock signal synthesizing circuit. In such applications, more than one reference clock signal may be coupled to the phase-locked loop circuit through conventional multiplexer circuits. More particularly, the reference clock signals are coupled to inputs of a multiplexer circuit and an output of such circuit is coupled to the phase-locked loop circuit. In response to a control signal, the multiplexer couples a selected one of the reference clock signals to an output thereof and, thus, to the phase-locked loop circuit. In this way, the signal synthesizing circuit may be fed by the alternate reference clock signal in the event of a failure on the primary reference clock signal. While this method may be adequate for monitoring the frequency of one or more reference clock signals, it does not provide any indication of the presence or absence of an error in the frequency of the synthesized output signals produced by the phase-locked loop and divider circuits. Thus, even if the phase-locked loop circuit detects the absence of an error in the frequency of the reference clock signals, there may in fact be an error in the frequency of one or more of the synthesized output signals due a failure within the signal synthesizing circuitry.

SUMMARY OF THE INVENTION

It is an object of the present invention to provide an improved telephone communication system.

It is also an object of the invention to provide a telephone communication system having an improved timing circuit for synthesizing and monitoring clock signals for use in such system.

It is a further object of the invention to reduce the time during which a telephone communication system is inoperable due to a failure and to improve system reliability.

Another object of the invention is to provide a circuit for monitoring a characteristic of an electrical signal.

It is a further object of the present invention to provide a circuit for monitoring the frequency of an electrical signal.

A still further object is to provide a relatively inexpensive circuit for monitoring the frequency of electrical clock signals.

Another object of the present invention is to provide a circuit for monitoring the operation of a clock signal synthesizing circuit.

A further object is to provide a circuit for monitoring the frequency of electrical signals and the operation of a clock signal synthesizing circuit while also enabling such monitoring circuit to provide alternate, or redundant, frequency synthesized output signals in the event that a failure is detected in the clock signal synthesizing circuit.

These and other objects of the invention are obtained generally by providing a circuit wherein a signal synthesizing circuit section thereof is responsive to an input signal and generates a first plurality of frequency synthesized output signals. Each of the first plurality of frequency synthesized output signals has a different frequency. A phase-locked loop circuit section is coupled to the signal synthesizing circuit section. The phase-locked loop circuit section provides, at an output thereof, a control signal indicating the deviation of the frequency of at least one of the plurality of frequency synthesized output signals from a reference frequency.

With this arrangement, the phase-locked loop circuit section provides an indication of the frequency of at least one frequency synthesized output signal. More particularly, the control signal provided by the phase-locked loop circuit is a logic signal and indicates whether the deviation of the frequency of the monitored synthesized output signal from the reference frequency is less than a predetermined frequency range. Here, the predetermined frequency range corresponds to the bandwidth of the phase-locked loop circuit and the reference frequency corresponds to the center frequency of a voltage controlled oscillator contained in the phase-locked loop circuit. This arrangement provides a relatively inexpensive and effective circuit for monitoring the frequency of electrical signals, here, such signals being at least one, and preferably each of the plurality of frequency synthesized output signals.

In accordance with a further feature of the present invention, the phase-locked loop circuit section includes a first selector means, fed by said at least one of the plurality of frequency synthesized output signals and the input signal. The selector means couples either one of the signals fed thereto to the phase-locked loop circuit section, selectively in response to a control signal.

With this arrangement, the operation of the signal synthesizing circuit, in addition to the frequencies of the frequency synthesized output signals can be monitored. More particularly, the frequencies of at least one, and preferably each, of the plurality of frequency synthesized output signals is monitored. Specifically, in response to the control signal, the selector means couples the at least one of the plurality of frequency synthesized output signal fed thereto to the phase-locked loop circuit section. In turn, the control signal provided by the phase-locked loop circuit section indicates the deviation of the frequency of the at least one frequency synthesized output signal from a reference frequency, thereby indicating the frequency of such output signal. Furthermore, by having the input signal also coupled to the selector means, such selector means can couple the input signal to the phase-locked loop circuit section in response to the control signal. With the input signal coupled to the phase-locked loop circuit, the control signal provided by such phase-locked loop circuit indicates the frequency of the input signal. Based on the control signal provided by the phase-locked loop circuit when the input signal is coupled thereto by the selector means and when one of the plurality of frequency synthesized output signals is coupled thereto by the selector means, a failure can be isolated to either the input signal or the signal synthesizing circuit itself. In other words, if the phase-locked loop generated control signal indicates that the frequency of the monitored frequency synthesized output signal is not accurate and that the frequency of the input signal is accurate, then the failure is determined to be in the frequency synthesizing circuit itself. However, if such control signal indicates an error, or fault, in both the input signal and the frequency synthesized output signal, then the failure is determined to be with the input signal.

In accordance with another feature of the present invention, the circuit includes alternate signal synthesizing circuit means, coupled to the phase-locked loop circuit section, for generating a second plurality of frequency synthesized output signals. The frequencies of the second plurality of output signals correspond to the frequencies of the first plurality of output signals.

With this arrangement, the circuit monitors the frequencies of at least one of the first plurality of frequency synthesized output signals and the input signal and isolates a fault to either the input signal or the signal synthesizing circuit, as described above. Additionally, such arrangement provides an alternate, or redundant, second plurality of frequency synthesized output signals. In other words, the second plurality of frequency synthesized output signals is identical to the first plurality of frequency synthesized output signals and may be used in place thereof. This feature improves the reliability of the signal synthesis and reduces the time during which the circuit is inoperable due to a failure since, in the event that a failure is detected in the signal synthesizing circuit itself, the desired frequency synthesized output signals are provided by the alternate signal synthesizing circuit.

In accordance with a further aspect of the present invention, the circuit includes an output selector circuit section coupled to both the first and second pluralities of frequency synthesized output signals. The output selector circuit section couples, in response to a control signal, either the first or the second plurality of frequency synthesized output signals to a plurality of outputs of such output selector circuit section.

With this arrangement, the second plurality of frequency synthesized output signals can be coupled to the telephone communication system. In other words, in normal operation, the output selector circuit section selects, in response to the control signal, the first plurality of frequency synthesized output signals for coupling to the plurality of outputs of such circuit section and, thus, to the telephone communication system. However, if a fault is detected in the signal synthesizing circuit section which generates the first plurality of output signals, then the output selector circuit section couples, in response to the control signal, the second plurality of frequency synthesized output signals to the telephone communication system. In this way, the telephone communication system continues to be fed the requisite clock signals even though the signal synthesizing circuit has failed.

In accordance with another, feature of the present invention, the signal synthesizing circuit section includes a second selector means fed by the input signal and an alternate input signal. The second selector means couples a selected one of either the input signal or the alternate input signal to an output thereof. The signal synthesizing means generates the first plurality of frequency synthesized output signals in response to the selected one of either the input signal or the alternate input signal.

With this arrangement, if an error is detected in the frequency of the input signal, then the second selector means couples, in response to the control signal, the alternate input signal to the means for synthesizing the first plurality of frequency synthesized output signals. Furthermore, the accuracy of the frequency of the alternate input signal is verified prior to such alternate signal being coupled to the signal synthesizing means. In this way, the circuit reliability will be improved since the first plurality of frequency synthesized output signals will be generated in response to a signal (i.e. the alternate input signal) having an accurate frequency even in the presence of an error in the frequency of the input signal.

BRIEF DESCRIPTION OF THE DRAWINGS

The foregoing features of this invention, as well as the invention itself, may be more fully understood from the following detailed description of the drawings in which.

DESCRIPTION OF THE PREFERRED EMBODIMENTS

Figure 1:
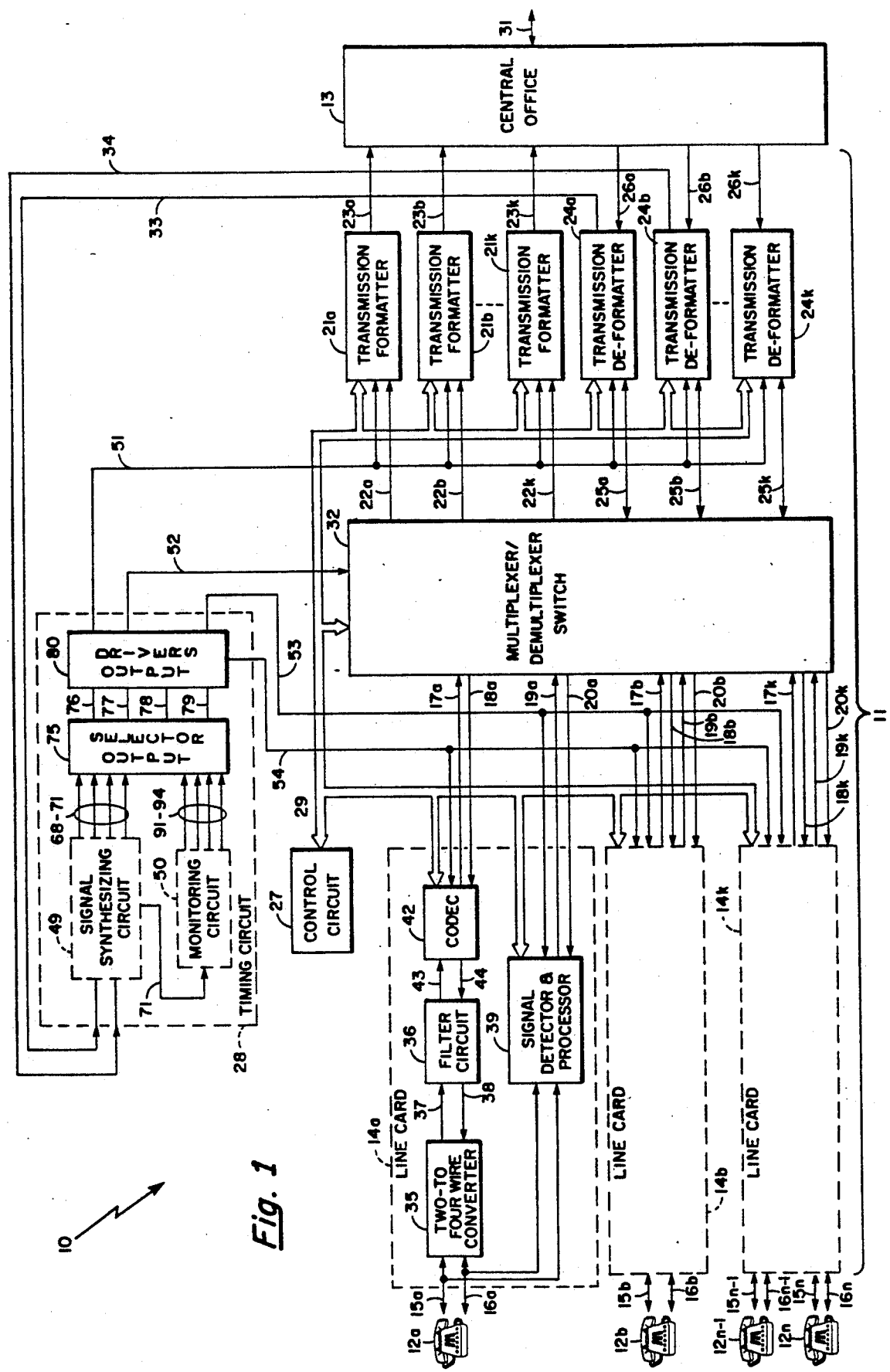
FIG. 1 is a somewhat simplified block diagram of a telephone communication system in accordance with the present invention.
Figure 2:
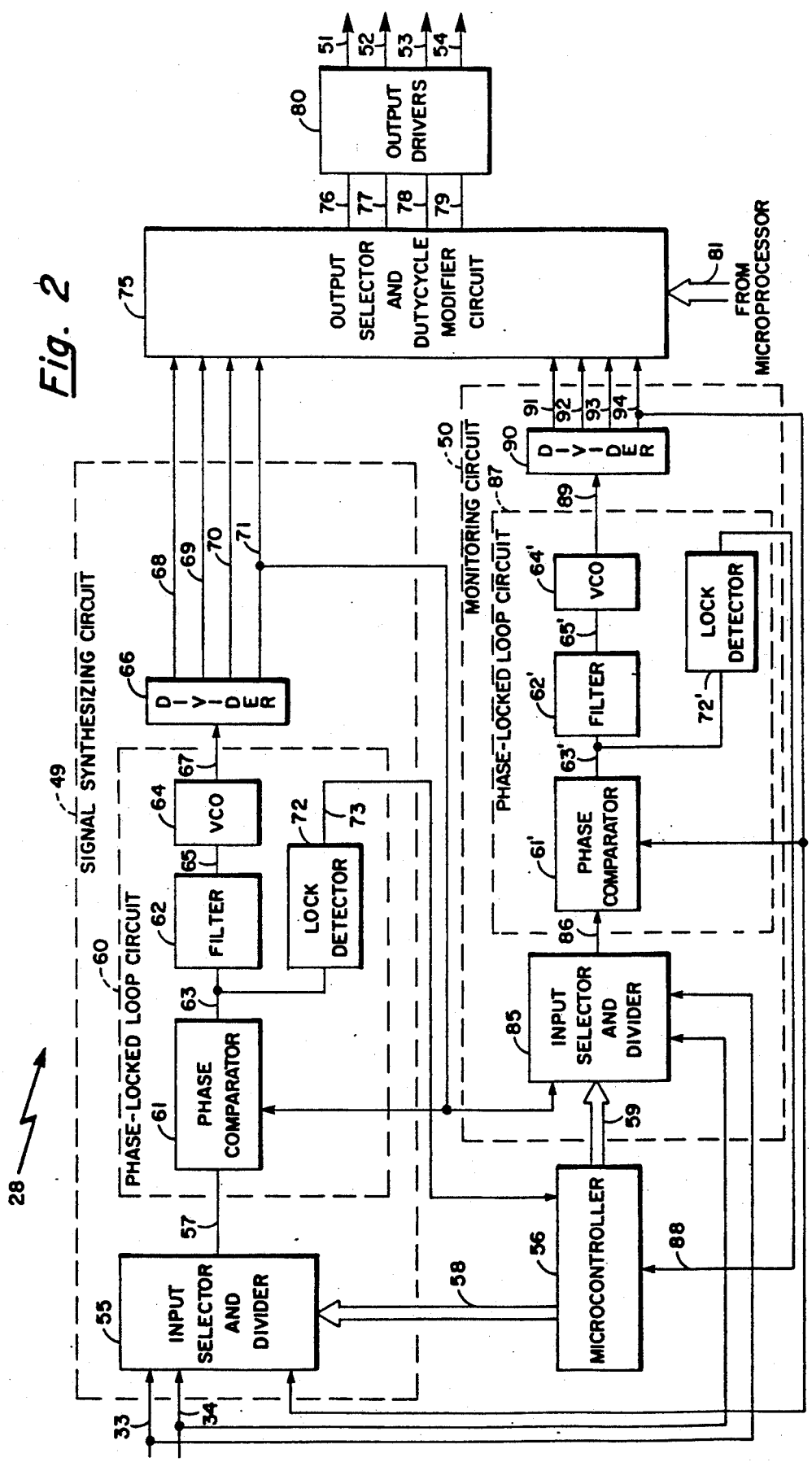
FIG. 2 is a schematic diagram of a frequency synthesizing and monitoring circuit used in the telephone communication system of FIG. 1 in accordance with the present invention.

Referring now generally to FIGS. 1 and 2, a timing circuit 28, also referred to herein as a signal synthesizing and monitoring circuit 28, is shown to include a signal synthesizing circuit section 49 and a monitoring circuit section 50. The signal synthesizing circuit section 49 is responsive to an input, or primary reference clock signal carried by signal line 33, and here, is also fed by an alternate, or secondary, reference clock signal carried by signal line 34. Signal synthesizing circuit section 49 generates, in response to a reference clock signal fed thereto, a first plurality of frequency synthesized signals carried by signal lines 68-71, each one of such output signals, here, having a different frequency. Timing circuit 28 further includes a monitoring circuit section 50 having a phase-locked loop circuit 87 (FIG. 2). Monitoring circuit section 50 is coupled to signal synthesizing circuit section 49, here via signal line 71. The phase-locked loop circuit 87 provides, at an output thereof, a control signal, carried by signal line 89, indicating the deviation of the frequency of one of the plurality of frequency synthesized output signals, here such signal being carried by signal line 71, from a reference frequency, as will be described in detail hereinafter.

Referring now specifically to FIG. 1, a telephone communication system 10 includes a digital loop carrier system 11 coupled between a plurality of subscribers 12a-12n and a central office 13 in a conventional Integrated Digital Loop Carrier (IDLC) system, as shown. Alternatively, digital loop carrier system 11 may be referred to as a remote digital terminal (RDT) and be coupled between the plurality of subscribers 12a-12n and a similar digital loop carrier system, referred to as a central office terminal (COT), (not shown) in a conventional Universal Digital Loop Carrier (UDLC) system. In other words, digital loop carrier system 11 is coupled between the plurality of subscribers 12a-12n and central office equipment consisting of a central office terminal (COT) in the case of a UDLC system or the central office 13, as shown here, in the case of an IDLC system.

Conventional, digital loop carrier system 11 includes a plurality of line cards 14a-14k, each one of such line cards 14a-14k corresponding to at least one of the plurality of subscribers 12a-12n and being adapted for coupling thereto via signal line pairs 15a,16a-15n,16n. Conventional line cards 14a-14k may be designed to accommodate, and be coupled to, one or several subscribers 12a-12n. For example, line card 14a is coupled to a single corresponding subscriber 12a via signal line pair 15a, 16a; whereas line card 14k is coupled to two corresponding subscribers 12n-1 and 12n via signal line pairs 15n-1, 16n-1 and 15n, 16n, respectively. Digital loop carrier system 11 further includes a conventional multiplexer/demultiplexer switch 32 which is coupled to each one of the plurality of line cards 14a-14k via two signal line pairs 17a, 18a, and 19a, 20a to 17n, 18n and 19n, 20n respectively, as shown. A plurality of transmission formatting circuits 21a-21k are coupled to multiplexer/demultiplexer switch 32 by a plurality of signal lines 22a-22k, respectively. Transmission formatting circuits 21a-21k are further adapted for coupling to central office 13 by signal lines 23a-23k, respectively. Digital loop carrier system 11 also includes a plurality of transmission de-formatting circuits 24a-24k, each one of such circuits 24a-24k corresponding to one of the plurality of transmission formatting circuits 21a-21k, respectively. Transmission de-formatting circuits 24a-24k are coupled to multiplexer/demultiplexer switch 32 by signal lines 25a-25k, respectively, and are further adapted for coupling to central office 13 by signal lines 26a-26k, respectively. In certain applications, it may be desirable to combine the formatting and de-formatting functions, of circuits 21a and 24a for example, in a single circuit. A control circuit 27 is coupled to each one of the plurality of line cards 14a-14k, multiplexer/demultiplexer switch 32, each one of the plurality of transmission formatting circuits 21a-21k, and each one of the plurality of transmission de-formatting circuits 24a-24k via control signal bus 29, as shown.

Digital loop carrier system 11 further includes a timing, or frequency synthesizing and monitoring circuit 28, such circuit 28 having a signal synthesizing circuit section 49 and a monitoring circuit section 50. Signal synthesizing circuit section 49 is coupled to monitoring circuit 50 via signal line 71, as will be described in conjunction with FIG. 2. Here, timing circuit 28, and more particularly, signal synthesizing circuit section 49, is fed by, and coupled to, reference clock signal lines 33 and 34. Signal line 33 is further coupled to transmission de-formatting circuit 24a and may be referred to as primary reference clock signal line 33. Signal line 34 is further coupled to transmission de-formatting circuit 24b and may be referred to as a secondary, or alternate reference clock signal line 34. A plurality of clock, or frequency synthesized output signal lines 51–54 of timing circuit 28 are fed throughout digital loop carrier system 11. More particularly, output signal line 51 is coupled to each of the transmission formatting and de-formatting circuits 21a–21k and 24a–24k, respectively. Output signal line 52 is coupled to conventional multiplexer/demultiplexer switch 32. Furthermore, clock signal lines 53 and 54 are coupled to each of the plurality of line cards 14a–14k, as shown.

Here, the digital loop carrier system 11 is a conventional time division multiplexing (TDM) system which is capable of transmitting and receiving information in a variety of conventional formats, such as T1 or CEPT formats. For example, with the T1 format, the information transmitted and received by digital loop carrier system 11 via signal lines 23a–23k and 26a–26k, respectively, is quantized into 8 bits and the time period during which each of the plurality of line cards 14a–14k is sampled by conventional multiplexer/demultiplexer switch 32 is referred to as a frame. In accordance with T1 format, signalling information is provided by the transmission formatting circuits 21a–21k at the 8th bit, or signalling bit, of every 6th frame in the case of a conventional robbed bit signaling scheme.

In operation, telephone communication system 10 electrically couples one of the plurality of subscribers 12a–12n, or a "calling" subscriber, to another one of the plurality of subscribers 12a–12n, or a "called" subscriber, through digital loop carrier system 11 and central office 13. Furthermore, central office 13 may be coupled, via a signal line 31, to other telephone communication systems (not shown) so that any one of the subscribers 12a–12n can be coupled to a subscriber in such other telephone communication systems. The electrical coupling provided between a pair of subscribers, for example between 12a and 12b, allows analog voice and/or digital data information to be exchanged therebetween. Here, each of the plurality of subscribers 12a–12n is shown to be a telephone; however, in certain applications it may be desirable to replace any one of the telephone subscribers 12a–12n with a private branch exchange.

Each one of the plurality of conventional line cards 14a–14k is substantially identical in construction. An exemplary, simplified one of line cards 14a–14k, here line card 14a, includes a two-to-four wire converter circuit 35, a filter circuit 36, a coder/decoder (i.e. CODEC) 42, and a signal detector and processor circuit 39. More particularly, subscriber 12a is coupled to two-to-four wire converter circuit 35 and signal processor and detector circuit 39 via signal line pair 15a,16a. Two-to-four wire converter circuit 35 is coupled to filter circuit 36 by signal line pair 37,38, and filter circuit 36 is further coupled to CODEC 42 by signal line pair 43,44. Line card 14a is coupled to switch 32 by data information signal line pair 17a,18a and signalling information signal line pair 19a, 20a, as shown.

When analog voice information, for example, is transmitted from subscriber 12a to central office 13, such information is carried by signal line 15a to line card 14a. More particularly, the information is coupled to two-to-four wire converter circuit 35 and to signal detector and processor circuit 39. Conventional signal processor and detector circuit 39 detects on and off hook conditions of the corresponding subscriber 12a and processes dialing and ringing information accordingly. Circuit 39 is coupled to switch 32 via signalling information signal line pair 19a,20a. Two-to-four wire converter circuit 35 may be either a conventional transformer based circuit or, alternatively, an integrated circuit such as the Subscriber Line Interface Circuit (SLIC) PBL3764 manufactured by Ericsson of Sweden. From circuit 35, the information transmitted by subscriber 12a is coupled to filter circuit 36 by signal line 37 as shown.

Filter circuit 36 bandlimits the analog information, to approximately 4 KHz, for example, in order to avoid aliasing, a phenomenon in which the signal is sampled at a rate lower than twice the highest frequency of the signal, which is called the Nyquist rate. If the analog signal is sampled at such a low rate, or in other words, with such a large sampling period, the signal cannot be accurately recovered once it is digitally transmitted to central office 13 and, thus, the information becomes distorted.

Filter circuit 36 is further coupled to CODEC 42 by signal line pair 43, 44. CODEC 42 converts the analog voice information transmitted from subscriber 12a by signal line 43 into digital information for transmission over data signal line 17a to multiplexer/demultiplexer switch 32. Conversely, when data information is transmitted from central office 13 to subscriber 12a via signal line 18a, CODEC 42 converts the digitally transmitted information into analog data for further transmission to subscriber 12a.

When information is transmitted by subscriber 12a, multiplexer/demultiplexer switch 32 multiplexes the data information carried by signal line 17a and the signalling information carried by signal line 19a. Switch 32 further couples the multiplexed data and signalling information to a selected one of signal lines 22a–22k for transmission to a selected one of the plurality of transmission formatting circuits 21a–21k. The one of the plurality of transmission formatting circuits 21a–21k to which the information is coupled, for example circuit 21a, modifies the information thus received by adding signalling information. For example, in the case of a conventional T1 system, signalling information is added at the 8th bit, or signalling bit, of every 6th frame. Once the information is formatted by circuit 21a, it is transmitted to central office 13 via signal line 23a. The signalling information provided by formatting circuit 21a enables central office 13 to effectively process such information.

Conversely, when information is transmitted from central office 13 to subscriber 12a, for example, such information is coupled to one of the plurality of transmission de-formatting circuits 24a–24k, for example circuit 24a, via signal line 26a. Transmission de-formatting circuit 24a effectively reverses the formatting process and extracts signalling and framing information for further use in the system 10 prior to transmission via signal line 25a to multiplexer/demultiplexer switch 32. It should be noted that the formatting and de-formatting functionality of circuits 21a–21k and 24a–24k, respectively, may alternatively be distributed to other parts, or circuits, of system 10. Switch 32 demultiplexes the information thus received and transmits the data information to line card 14a via signal line 18a and the signalling information to line card 14a via signal line 20a. More particularly, the data information carried by signal line 18a is transmitted to CODEC 42 which converts the digitally transmitted information into an analog signal for further transmission to filter circuit 36 by signal line 44. From filter circuit 36, the analog information is transmitted to converter circuit 35 via signal line 38 and to subscriber 12a via signal line pair 15a, 16a. The signalling information received by signal detector and processor circuit 39 via signal line 20a is processed and any appropriate framing and signalling information is transmitted to subscriber 12a.

Control circuit 27 includes a microcontroller (not shown) and controls various functions of the digital loop carrier system 11. More particularly, conventional control circuit 27 provides a control signal bus 29 which carries digital control signals to each of the plurality of line cards 14a-14k, as shown. Specifically, with respect to exemplary line card 14a, control signal bus 29 is coupled to signal detector and processor circuit 39 and CODEC 42. The control signals thus provided regulate the time division multiplexing of the information provided by each of the plurality of line cards 14a-14k to generate and receive the time division multiplexed data and signalling information carried by signal lines 17a and 19a, respectively. Control circuit 27 is further coupled to multiplexer/demultiplexer switch 32 and controls the multiplexing and demultiplexing operations of switch 32. Control signal bus 29 is further coupled to each one of the plurality of transmission formatting circuits 21a-21k and transmission de-formatting circuits 24a-24k, as shown. The control signals thus provided regulate the operation of such circuits 21a-21k and 24a-24k as a function of the system type. More particularly, the control signals determine that the signalling information is compatible with a particular transmission format, such as T1 or CEPT format.

As mentioned above, timing circuit 28 provides clock, or timing signals to digital loop carrier system 11. More particularly, a first plurality of frequency synthesized output signals, carried by signal lines 68-71, and a second plurality of frequency synthesized output signals, carried by signal lines 91-94, are coupled to an output selector circuit 75. In a manner to be described hereinafter, output selector circuit 75 couples one of the pluralities of signal lines fed thereto 68-71 or 91-94 to a plurality of signal lines 76-79 which feed output drivers 80. Conventional output drivers 80 are coupled to frequency synthesized output signal lines 51-54, as shown. Clock signal line 53 carries a clock signal to the signal detector and processor circuit on each of the plurality of line cards 14a-14k, for example circuit 39 on exemplary line card 14a, to regulate the timing of the multiplexing of signalling information provided by circuit 39 onto signal line 19a. Similarly, signal line 54 carries a clock signal to the CODEC on each of the plurality of line cards 14a-14k, for example CODEC 42 on exemplary line card 14a, to control the rate of the time division multiplexing of the data information carried by signal line 17a. Multiplexer/demultiplexer switch 32 is also fed a clock signal from timing circuit 28 via signal line 52, such clock signal regulating the rate of the multiplexing and demultiplexing functions of switch 32. Timing circuit 28 is further coupled to each of the plurality of transmission formatting circuits 21a-21k and transmission de-formatting circuits 24a-24k to provide clock signals for time regulating the addition and extraction of framing and signalling information by such circuits 21a-21k and 24a-24k, respectively.

Timing circuit 28 is coupled to, and fed by, at least one transmission de-formatting circuit 24a and, here, two transmission de-formatting circuits 24a and 24b via primary and secondary reference clock signal lines 33 and 34, respectively. The reference clock signals carried by signal lines 33 and 34 are used by timing circuit 28 to generate, or synthesize, the plurality of frequency synthesized clock, or output, signals carried throughout digital loop carrier system 11 by signal lines 51-54. More particularly, the clock signal carried by primary reference clock signal line 33 is used to generate the plurality of frequency synthesized output signals carried by signal lines 51-54 in normal system operation. However, if a failure, or fault is detected on the primary reference clock signal line 33, in a manner described hereinafter, the clock signal carried by secondary reference clock signal line 34 is used to generate the plurality of frequency synthesized output signals carried by signal lines 51-54.

The frequency synthesized clock signals carried by signal lines 51-54 have frequencies which are, here, integer multiples of the frequency of the one of the reference clock signals from which such synthesized clock signals are generated. Furthermore, such clock signals, carried by signal lines 51-54, have a known phase relationship relative to the phase of the one of the reference clock signals used to generate such synthesized clock signals. In other words, depending on the particular phase-locked loop circuit used, the phase of the clock signals carried by lines 51-54 may be, as here, the same as the phase of the reference clock signal used to generate such clock signals, or may be shifted therefrom by a known amount, such as by 180 degrees. In this way, the operations of digital loop carrier system 11 regulated by the synthesized clock signals are "in-phase", or phase synchronized.

As noted, here, the primary reference clock signal line 33 and secondary reference clock signal line 34 are fed to timing circuit 28 from transmission de-formatting circuits 24a and 24b, respectively. More particularly, each of the transmission de-formatting circuits 24a-24k includes a clock recovery circuit (not shown) which, here, provides, inter alia, the reference clock signals carried by signal lines 33 and 34. It is noted that the input, or reference clock signal lines 33 and 34 may alternatively be supplied by other sources, or circuits, either within or external to, digital loop carrier system 11, if so desired.

Referring now to FIG. 2, timing circuit 28 is fed by reference clock signal lines 33 and 34, as shown. More particularly, reference clock signal lines 33 and 34 are coupled to signal synthesizing circuit section 49 and to monitoring circuit section 50. In response to one of the reference clock signal lines 33 or 34 coupled thereto, clock signal synthesizing circuit 49 generates a plurality of primary frequency synthesized clock signals carried by signal lines 68-71 and further coupled to signal lines 51-54 for use throughout digital loop carrier system 11, as described above. For example, reference clock signal lines 33 and 34 each may carry a signal having a frequency of 1.544 MHz in accordance with conventional T1 format, or a frequency of 2.048 MH in accordance with CEPT format transmission. Alternatively, input signal lines 33 and 34 may carry signals having other frequencies, such as 64 KHz, for example, a signal frequency which is conventionally present in telephone communication systems. Furthermore, reference clock signal lines 33 and 34 may carry signals having the same frequency as each other, or may carry signals having different frequencies. It may also be desirable to provide more than the two reference clock signal lines 33 and 34 shown here, such additional signal lines being provided by either additional transmission de-formatting circuits 24a-24k or by other circuits in digital loop carrier system 11 depending on the particular system configuration. The benefit of providing reference clock signals from more than one transmission de-formatting circuit 24a, for example, is that, in the event that the primary reference clock signal line 33 or the transmission de-formatting circuit 24a coupled thereto fails, clock signal synthesizing circuit 49 can be fed by secondary, or alternate reference clock signal line 34 from transmission de-formatting circuit 24b. Thus, frequency synthesized output signals will continue to be fed to digital loop carrier system 11 via signal lines 51-54 in the event of such a failure, as will be described.

Clock signal synthesizing circuit 49 includes a programmable logic device (PLD) which, here, is programmed to operate as an input selector and divider circuit 55. Here, circuit 55 is manufactured by Altera Corporation of Santa Clara, Calif., Part No. EP910. Reference clock signal lines 33 and 34 are coupled to inputs of circuit 55. A conventional microcontroller 56 is also coupled to circuit 55 by control signal bus 58. In response to a control signal, hereinafter also referred to as a primary control signal, provided by microcontroller 56, input selector and divider circuit 55 couples a selected one of the input, or reference clock signal lines 33, 34 (or input signal line 94, to be discussed hereinafter) to an internal divider circuit which, in turn, provides an output signal, via signal line 57, having a predetermined frequency. In other words, circuit 55 is programmed, in accordance with the frequencies of the input signals thereto, to provide an output signal having a predetermined frequency. Thus, regardless of the frequency of the signals carried by input signal lines 33, 34, circuit 55 appropriately divides the selected one of such signals to provide, at signal line 57, a signal having the predetermined frequency. For example, signal line 57 may carry an 8 KHz signal.

Signal line 57 is coupled to a conventional phase-locked loop circuit 60 which generates a signal, carried by signal line 67, which is "phase-locked" to the signal carried by line 57. Phase-locked loop circuit 60 is a commercially available integrated circuit, such as Part No. 74HC7046 manufactured by RCA Corporation, Solid State Division of Somerville, N.J. Simply stated, phase-locked loop 60 includes a phase comparator 61, to which signal line 57 is coupled, and which, in turn, is coupled to a filter circuit 62, by a signal line 63. It should be noted that filter circuit 62 is, here, comprised of a resistor and capacitor network disposed external to the phase-locked loop circuit 60, as is conventional. Alternatively, such external filter circuit 62 may include a conventional active filter arrangement. Signal line 63 is further coupled to a lock detector circuit 72 which generates a logic control signal carried by signal line 73 to microcontroller 56 as will be described hereinafter. Filter circuit 62 is further coupled to a voltage controlled oscillator (VCO) 64 by a signal line 65. The center frequency of the VCO 64 (i.e. the nominal frequency at which VCO 64 oscillates) and the bandwidth of the phase-locked loop circuit 60 (i.e. the frequency range over which the phase of the signal carried by line 67 tracks the phase of the signal carried by line 57) are determined by the filter circuit 62 described above, as is conventional. For example, the center frequency of the VCO 64 may be 4.096 MHz, with a bandwidth of approximately ±750 KHz. The output of VCO 64, carried by signal line 67, is fed to an external divider circuit 66.

Divider circuit 66 provides the first, or primary, plurality of frequency synthesized signals carried by signal lines 68-71, with the frequencies of each of the plurality of signals, here, being integer multiples of the frequency of the selected one of the reference clock signals carried by signal lines 33 and 34. For example, primary reference clock signal line 33 may carry a 2.048 MHz signal in accordance with conventional CEPT format transmission and frequency synthesized signal lines 68-71 may carry signals having frequencies of 2.048 MHz, 64 KHz, and 8 KHz. Here, divider circuit 66 is a programmable logic device, Part No. EP910, manufactured by Altera Corporation of Santa Clara, Calif. One of the output signal lines of divider 66, here signal line 71, carries a signal with a nominal frequency equal to the predetermined frequency of the signal carried by line 57, such as an 8 KHz signal, and is coupled to phase comparator 61 in a feedback relationship, as shown.

In operation, phase comparator 61 compares the phase of the signal carried by signal line 57 with that of the feedback signal carried by signal line 71. Phase comparator 61 generates a pulse waveform, carried by signal line 63, having a duty cycle proportional to the phase difference between the signals carried by signal lines 57 and 71. The signal generated by phase comparator 61 is coupled to filter circuit 62 by signal line 63. Filter circuit 62 sets the bandwidth of phase-locked loop circuit 60, or, in other words, the frequency range over which the input signal (carried by signal line 57) can vary and still be followed, or tracked, relatively accurately in phase by the output signal of the VCO 64 (carried by signal line 67). The output signal of filter circuit 62, carried by signal line 65, provides a control voltage, having a voltage level proportional to the phase difference between the signals carried by signal lines 57 and 71, to adjust the frequency at which VCO 64 oscillates. More accurately, filter circuit 62 provides the necessary control voltage to the VCO 64 to bring the output signal of VCO 64 to the desired frequency. Consider, for example, the case where the nominal center frequency of VCO 64 is 4.096 MHz and the bandwidth of phase-locked loop circuit 60 is ±750 KHz. When the phase of the signals carried by feedback signal line 71 and input signal line 57 are, here, the same, or, in the case of a phase-locked loop circuit which generates an output signal having a known phase relationship relative to the input signal, when such phases differ by that known shift, the phase difference is essentially zero and the output signal of VCO 64 has a frequency of 4.096 MHz. However, here, if the signals carried by such signal lines 57 and 71 have a phase difference, the output signal of VCO 64 will have a frequency which deviates from the nominal center frequency of 4.096 MHz in proportion to such phase difference and within the bandwidth of the phase-locked loop circuit 60. So, in the case of a ±750 KHz bandwidth, the frequency of the output signal of VCO 64 can vary any where from 3.346 MHz to 4.846 MHz in order to render the feedback signal (carried by signal line 71) in phase or "phase-locked" to the input signal (carried by signal line 57).

Divider circuit 66 couples signal line 67 to a plurality of internal dividers to provide the first plurality of frequency synthesized signals having different, predetermined frequencies and carried by signal lines 68-71. The division factors and, thus, the respective frequencies of the frequency synthesized signals carried b signal lines 68-71 are chosen based on the particular telephone communication system configuration. For example, as mentioned above, it may be desirable to generate signals having frequencies such as 2.048 MHz, 64 KHz, and 8 KHz for use throughout digital loop carrier system 11; with the nominal center frequency of VCO 64 at 4.096 MHz, the internal dividers would represent division factors of 2, 64, and 512, respectively.

Also provided at an output of phase-locked loop circuit 60 is a "lock detection" control signal carried by signal line 73. The "lock detection" control signal indicates whether the phase of the input signal to phase-locked loop 60, carried by signal line 57, is, here, the same as, or "phase-locked" to, that of the output signal of such circuit 60, carried by line 67. This phase indication also indicates the frequency of the input signal carried by signal line 57. In other words, the control signal indicates whether the frequency of the input signal, carried by signal line 57, has deviated the frequency of the VCO 64 from its center frequency by more than the bandwidth frequency range of the phase-locked loop circuit 60. For example, if the phase difference between the signals carried by lines 57 and 71 is greater than a value corresponding to the bandwidth of the phase-locked loop circuit 60, then the control signal, carried by signal line 73, is in a first state indicating that the signals carried by such lines 57 and 71 are "out-of-phase" (i.e. the presence of an error in the frequency of the selected one of reference clock signals, carried by signal line 33 or 34). On the other hand, if the phase difference between the signals carried by signal lines 57 and 71 is less than the value corresponding to the bandwidth of phase-locked loop circuit 60, then the control signal, carried by line 73, is in a second state, indicating that the signals carried by such lines 57 and 71 are in-phase or "phase-locked" (i.e. the absence of an error in the frequency of the selected one of the reference clock signals carried by line 33 or 34). The control signal line 73 may be fed to microcontroller 56 as an interrupt signal or may be fed into a counter circuit which provides a variable trigger threshold in order to prevent false "out-of-lock" indications when the timing circuit 28 is powering up, for example.

Primary frequency synthesized signal lines 68-71 are coupled to an output selector and duty cycle modifier circuit 75, as shown. Also coupled to circuit 75 is microcontroller 56 via control signal bus 81, as well as a second plurality of frequency synthesized signals carried by signal lines 91-94, as will be described hereinafter. Here, circuit 75 is programmable logic device, Part No. EP910, manufactured by Altera Corporation of Santa Clara, Calif. In response to an output control signal carried by signal bus 81, circuit 75 couples either the first plurality of frequency synthesized signals (i.e. primary frequency synthesized signals), carried by signal lines 68-71, or the second plurality of frequency synthesized signals (i.e. secondary frequency synthesized signals), carried by signal lines 91-94, to a plurality of output signal lines 76-79 thereof. Circuit 75 additionally can be programmed to modify the duty cycle of the selected plurality of frequency synthesized signals coupled thereto by either signal lines 68-71 or 91-94. Signal lines 76-79 are coupled to conventional output drivers 80 which provide the frequency synthesized output clock signals, carried by signal lines 51-54, with suitable characteristics for transmission to various circuits of digital loop carrier system 11, as described above.

Monitoring circuit section 50 is substantially identical in construction to signal synthesizing circuit section 49 and is fed by primary and secondary reference clock signal lines 33 and 34, respectively, as shown. Monitoring circuit section 50 is also fed a control signal from microcontroller 56 via control signal bus 59, as shown. More particularly, a programmable logic device 85, here, programmed to operate as an input selector and divider circuit 85 is fed by reference clock signal lines 33 and 34, control signal bus 59, and a primary frequency synthesized signal line 71 of phase-locked loop circuit 60. Here again, circuit 85 is Part no. EP910 manufactured by Altera Corporation of Santa Clara, Calif., and is programmed to operate as described above in conjunction with circuit 55. In response to a control signal, hereinafter also referred to as a secondary control signal, provided by microcontroller 56, input selector and divider circuit 85 couples a selected one of the input signal lines 33, 34, or 71 to an internal divider which divides the selected signal by a suitable factor to produce a signal, carried by line 86, having a predetermined frequency. The signal provided by input selector and divider circuit 85, carried by signal line 86, and may, for example, have a frequency of 8 KHz. Signal line 86 feeds a conventional phase-locked loop circuit 87 which contains components 61', 62', 64', and 72' corresponding to like components 61, 62, 64, and 72, of phase-locked loop circuit 60 and operating in the manner described above in conjunction with phase-locked loop circuit 60. Here, phase-locked loop circuit 87 is Part No. 74HC7046, manufactured by RCA Corporation, Solid State Division, Somerville, N.J. Phase-locked loop circuit 87 generates a lock detection, or control signal carried by signal line 88 and further provides an output signal carried by signal line 89 which is, in normal operation, "phase-locked" to the input signal carried by signal line 86. Signal line 89 is coupled to a divider circuit 90, here, a programmable logic device, like circuit 66 of FIG. 2. Divider circuit 90 couples signal line 89 to a plurality of internal dividers to provide the second plurality of frequency synthesized signal lines 91-94, carrying signals having predetermined frequencies. More particularly, here, the frequencies of the first plurality of frequency synthesized signals carried by signal lines 68-71 correspond to the frequencies of the second plurality of frequency synthesized signals carried b signal lines 91-94.

Lock detection, or control signal line 88 carries a logic signal indicative of whether the input signal to phase-locked loop circuit 87 (carried by signal line 86) and the output signal of such circuit 87 (carried by signal line 89) are in phase, or "phase-locked". Furthermore, as described above in conjunction with lock indicating signal line 73, the control signal carried by signal line 88 indicates the frequency of the signal carried by the selected one of signal lines 33, 34, or 71. More particularly, control signal line 88 indicates whether the frequency of the signal carried by line 86 (which corresponds to the selected one of the signals carried by line 33, 34, or 71, divided by a predetermined factor, by circuit 85) has deviated the frequency of the voltage controlled oscillator 64' from its center frequency by less than the bandwidth of the phase-locked loop 87. In this way, the presence or absence of an error in the frequency of such selected signal is determined; with the absence of an error corresponding to a frequency deviation of less than the bandwidth (i.e. the control signal carried by line 88 being in a first state) and the presence of an error corresponding to a frequency deviation of greater than the bandwidth (i.e. the control signal carried by line 88 being in a second state). In other words, that the frequency of the signal carried by line 86 has deviated the frequency of the VCO 64' from its center frequency by less than the bandwidth of circuit 87 is another way of saying that the difference in phase between the signals carried by line 86 and the feedback signal line 94 is less than the predetermined value corresponding to the bandwidth of the circuit 87.

The frequency determination provided by control signal line 88 may be used, here, by microcontroller 56, to generate the primary control signal coupled to input selector and divider circuit 55 (carried by control signal bus 58), the secondary control signal coupled to input selector and divider circuit 85 (carried by control signal bus 59), as well as the output control signal for output selector and duty cycle modifier circuit 75 (carried by control signal bus 81). Furthermore, signal line 88 may be fed to microcontroller 56 as an interrupt signal or may be fed into a counter circuit which provides a variable trigger threshold to prevent false failure indications, for example.

Here, monitoring circuit section 50 monitors the frequency of the reference clock signals carried by signal lines 33 and 34 and the frequency of the synthesized signal carried by signal line 71. More particularly, in response to a control signal carried by control signal bus 59, input selector and divider circuit 85 divides a selected one of the signal lines 33, 34, or 71, by a suitable factor to provide an output signal carried by signal line 86, having a predetermined frequency. Control signal line 88 indicates the frequency of the selected one of the signals carried by signal lines 33, 34, or 71. In other words, during a first time period, the primary reference clock signal, carried by line 33, is selected and during such time period, control signal line 88 indicates the presence or absence of an error in the frequency of such reference clock signal. Similarly, during a second time period, the secondary reference clock signal, carried by line 34, is selected and an indication of the presence or absence of an error in the frequency thereof indicated by control signal line 88. Additional input signals, such as that carried by primary frequency synthesized signal line 71, are selected by circuit 85 and an indication of an error in the frequency of such signals provided by control signal line 88, during subsequent time intervals.

The benefit of monitoring the status of primary and secondary reference clock signal lines 33 and 34, is that, in the event that one of such signal lines 33 or 34 fails, and prior to input selector and divider circuit 55 selecting the other of the signal lines 33 or 34, the status of such other signal line may be verified. In other words, if a failure is detected on primary reference clock signal line 33, for example, monitoring circuit 50, and more particularly input selector and divider circuit 85, selects the secondary reference clock signal line 34. Control signal line 88, thus, provides an indication to microcontroller 56 of the presence or absence of an error in the frequency of the secondary reference clock signal, carried by signal line 34, before input selector and divider circuit 55 selects the secondary reference clock signal line 34 for generating the first plurality of frequency synthesized signals, carried by signal lines 68-71.

As mentioned, monitoring circuit section 50 also monitors the frequency of, here, one of the first plurality of frequency synthesized signals, carried by line 71. More particularly, in response to the control signal carried by signal bus 59, input selector and divider circuit 85 couples signal line 71 to phase-locked loop circuit 87 and control signal line 88 indicates the presence or absence of an error in frequency thereof. Such monitoring is desirable to verify that the frequency of the synthesized clock signal carried by line 71 is accurate, or as desired. For this purpose, it may also be desirable to have additional frequency synthesized signal lines 68-70 coupled to monitoring circuit 50, and more particularly, to input selector and divider circuit 85. Thus, by coupling the plurality of frequency synthesized signal lines 68-71 to selector and divider circuit 85, such circuit 85 may, in response to an appropriate control signal, select any one of such plurality of signal lines 68-71 and provide a corresponding frequency error indication via control signal line 88. This arrangement enables the frequency of many signals, for example, reference clock signals carried by lines 33 and 34 and frequency synthesized signals carried by lines 68-71, to be monitored inexpensively, with a single monitoring circuit 50.

Monitoring circuit 50 also monitors the operation of the phase-locked loop circuit 60 itself. Although control signal line 73 provides a indication to microcontroller 56 as to whether the signal carried by line 67 is "phase-locked" to the signal carried by line 57 (i.e. whether there is an error in the frequency of the selected one of the input signals, carried by lines 33, 34, or 94), an indication of an "out-of-lock" condition is not determinative of whether the problem is due to an error on the primary reference clock signal line 33, for example, or a failure in the phase-locked loop circuit 60 itself. Monitoring circuit 50 isolates the failure by monitoring both the frequency of the primary reference clock signal carried by signal line 33, as described above, and subsequently monitoring a frequency synthesized signal, here, carried by signal line 71, as also described above. In other words, control signal line 88 provides microcontroller 56 with an indication of the presence or absence of an error in the frequency of the primary reference clock signal, carried by line 33, and subsequently of the presence or absence of an error in the frequency of the frequency synthesized signal carried by signal line 71. If control signal line 88 indicates a "phase-locked" condition (i.e. the absence of an error in frequency) when primary reference clock signal line 33 is being monitored, or selected, but indicates an "out-of-lock" condition (i.e. the presence of an error in the frequency) when frequency synthesized signal line 71 is being monitored, then the failure is determined to be in the phase-locked loop circuit 60 rather than primary reference clock signal line 33.

Furthermore, due to the signal synthesizing capability provided by monitoring circuit 50, upon a determination that phase-locked loop circuit 60 has failed, microcontroller 56 may designate monitoring circuit 50 to provide the system clock signals via signal lines 51-54. In other words, in response to an output control signal provided by microcontroller 56 to output selector circuit 75 via control signal bus 81, such circuit 75 couples the second plurality of frequency synthesized signal lines 91-94 (i.e. secondary frequency synthesized signal lines) to the digital loop carrier system 11 via signal lines 51-54.

It should be noted that an frequency synthesized signal line 94, generated by divider circuit 90, is coupled to input selector and divider circuit 55 so that circuits 49 and 50 are substantially identical in construction and, thus, interchangeable, if so desired.

Having described preferred embodiments of the invention, it will now become apparent to one of skill in the art that other embodiments incorporating their concepts may be used. For example, timing circuit 28 does not require microcontroller control but may, alternatively, consist of a manual interface, such as a panel selector switch and an LED display. It should also be appreciated that the timing circuit 28 described herein is not limited to use with a digital loop carrier system 11 or even in a telephone communication system 10. Generally, any electronic circuit or system utilizing clock signals, the frequency accuracy of which it is desirable to monitor, is a suitable application for the circuit described herein. It is felt, therefore, that these embodiments should not be limited to disclosed embodiments but rather should be limited only by the spirit and scope of the appended claims.

What is claimed is:

1. A circuit comprising:
   signal synthesizing means, responsive to an input reference clock signal, for generating a first plurality of frequency synthesized output signals, each one of said first plurality of output signals having a different frequency; and
   monitoring means, coupled to the signal synthesizing means and including a phase-locked loop circuit, for providing at an output of such phase-locked loop circuit, a control signal indicating the deviation of the frequency of at least one of the plurality of frequency synthesized output signals from a reference frequency.

2. The circuit recited in claim 1 further comprising first selector means, fed by said at least one of the plurality of frequency synthesized output signals and said input signal, for coupling either one of the signals fed to the first selector means to the monitoring means selectively in response to a control signal.

3. The circuit recited in claim 2 further comprising means, coupled to the monitoring means, for generating a second plurality of frequency synthesized output signals, the frequencies of said second plurality of frequency synthesized output signals corresponding to the frequencies of said first plurality of frequency synthesized output signals.

4. The circuit recited in claim 3 further comprising an output selector means, coupled to the first plurality of frequency synthesized output signals and to the second plurality of frequency synthesized output signals, for coupling, in response to a control signal, either said first plurality of output signals or said second plurality of output signals to a plurality of outputs of said output selector means.

5. The circuit recited in claim 2 wherein the signal synthesizing means includes second selector means, fed by said input signal and an alternate input signal, for coupling either the input signal or the alternate input signal to an output thereof selectively in response to a control signal and wherein said signal synthesizing means generates said first plurality of frequency synthesized output signals in response to the selected one of either the input signal or the alternate input signal.

6. A signal synthesizing and frequency monitoring circuit comprising:
   signal synthesizing means fed by an input reference clock signal for generating, in response to said input signal, a first plurality of frequency synthesized output signals, each one of said first plurality of output signals having a different frequency, such frequency being on integer multiple of the frequency of the input signal; and
   frequency monitoring means comprising a phase comparator fed by at least one of said first plurality of frequency synthesized output signals and a voltage control oscillator coupled to said phase comparator, said voltage controlled oscillator having a center frequency associated therewith and said phase-locked loop circuit means having a bandwidth frequency range associated therewith, for providing a logic signal in a first state when the deviation of the frequency of the one of the plurality of frequency synthesized output signals fed thereto from said center frequency is within said bandwidth frequency range and in a second state when the deviation of the frequency of the one of the plurality of frequency synthesized output signals fed thereto from said center frequency is outside of said bandwidth frequency range.

7. A signal synthesizing and monitoring circuit comprising:
   (a) primary signal synthesizing circuit comprising:
     (i) primary selector means, fed by a primary clock signal and a secondary clock signal, for coupling, in response to a primary control signal, either the primary clock signal or the secondary clock signal to an output thereof selectively in response to the primary control signal; and
     (ii) means, responsive to the selected one of either the primary clock signal or the secondary clock signal, for generating a plurality of primary frequency synthesized output signals, each one of said plurality of output signals having a different frequency;
   (b) secondary signal synthesizing and monitoring circuit comprising:
     (i) secondary selector means, fed by said primary clock signal and at least one of said plurality of primary frequency synthesized output signals, for coupling in response to a secondary control signal, either said primary clock signal or said at least one primary frequency synthesized output signal to an output thereof selectively in response to the secondary control signal; and
     (ii) a phase-locked loop circuit, responsive to the selected one of either the primary clock signal or the at least one primary frequency synthesized output signal, for generating a plurality of secondary frequency synthesized output signals, each one of said plurality of secondary output signals having a corresponding one of said frequencies, and for producing a selector control signal in accordance with the presence or absence of an error in the frequency of the selected one of either the primary clock signal or the at least one primary frequency synthesized output signals;
   (c) output selector means, fed by said plurality of primary frequency synthesized output signals and said plurality of secondary frequency synthesized output signals, for coupling, in response to an output control signal, either of said pluralities of output signals to a plurality of outputs thereof; and
   (d) control means, responsive to said selector control signal, for generating said primary control signal, said secondary control signal, and said output control signal.

8. A digital loop carrier system coupled between a plurality of subscribers and central office equipment, said digital loop carrier system comprising:
a plurality of line cards, each one of said cards corresponding to at least one of the plurality of subscribers and adapted for being coupled thereto;
a multiplexer/demultiplexer switch coupled to said plurality of line cards;
a plurality of transmission formatting/de-formatting circuits coupled to said multiplexer/demultiplexer switch and adapted for coupling to said central office equipment; and
a control circuit and a timing circuit, each of said control and timing circuits being coupled to said plurality of line cards, said multiplexer/demultiplexer switch, and said plurality of transmission formatting/de-formatting circuits, wherein said timing circuit comprises signal synthesizing means, responsive to an input reference clock signal, for generating a first plurality of frequency synthesized output signals, each one of said first plurality of output signals having a different frequency; and monitoring means including a phase-locked loop circuit, coupled to the signal synthesizing means, for providing at an output of such phase-locked loop circuit, a control signal indicating the deviation of the frequency of the at least one of the plurality of frequency synthesized output signals from a reference frequency.

9. The digital loop carrier system recited in claim 8 wherein said timing circuit includes a first selector means, fed by said at least one of the plurality of frequency synthesized output signals and said input signal, for coupling either one of the signals fed to the first selector means to the monitoring means selectively in response to a control signal.

10. The digital loop carrier system recited in claim 9 wherein said timing circuit includes means, coupled to the monitoring means, for synthesizing a second plurality of frequency synthesized output signals, the frequencies of said second plurality of frequency synthesized output signals corresponding to the frequencies of said first plurality of frequency synthesized output signals.

11. The digital loop carrier system recited in claim 10 wherein said timing circuit further includes an output selector means, coupled to the first plurality of frequency synthesized output signals and to the second plurality of frequency synthesized output signals, for coupling, in response to a control signal, either said first plurality of output signals or said second plurality of output signals to a plurality of outputs of said output selector means.

12. The digital loop carrier system recited in claim 9 wherein the signal synthesizing means includes a second selector means, fed by said input signal and an alternate input signal, for coupling a selected one of either the input signal or the alternate input signal to an output thereof and wherein said signal synthesizing means generates said first plurality of frequency synthesized output signals in response to the selected one of either the input signal or the alternate input signal.

13. A method of operating a system comprising the steps of:
producing, in response to a first input signal, a plurality of primary output signals having different frequencies;
producing, in response to a second input signal, a plurality of secondary output signals having said different frequencies;
monitoring a primary clock signal and/or a selected one of the plurality of primary output signals with a phase-locked loop circuit to determine the presence or absence of an error in the frequency of a primary clock signal and/or a selected one of the plurality of primary output signals; and
coupling, to outputs of the system, in the absence of an error in the frequency of the primary clock signal and the selected one of the plurality of primary output signals, the plurality of primary output signals and, concurrently therewith, providing the primary clock signal as the first input signal.

14. The method recited in claim 13 including the step of coupling, to outputs of the system, the plurality of secondary output signals and providing the primary clock signal as the second input signal in the absence of an error in the frequency of the primary clock signal and the presence of an error in the frequency of the selected one of the plurality of primary output signals.

15. The method recited in claim 14 including the step of coupling, to outputs of the system, the plurality of primary output signals and providing an alternate clock signal as the first input signal in the presence of an error in the frequency of the primary clock signal and the absence of an error in the frequency of the selected one of the plurality of primary output signals.

16. A circuit comprising:
selector means, fed by a first signal and a second signal, for coupling said first signal to an output of said selector means during a first period of time and said second signal to said output during a second period of time;
monitoring means, responsive to the signal coupled to the output of the selector means, for determining the presence or absence of an error in the frequency of said first signal during said first period of time and the presence or absence of an error in the frequency of said second signal during said second period of time; and
signal synthesizing means, responsive to an input signal, for producing, at one of a pair of outputs thereof, said first signal, and wherein said selector means includes means for dividing, during said first time period, the frequency of the first signal by a factor corresponding to the one of the pair of outputs of said signal synthesizing means where said first signal is produced.

17. The circuit recited in claim 16 wherein said selector means is fed by a third signal and includes means for coupling said third signal to an output of said selector means during a third period of time and wherein said third signal is produced at a second output of said signal synthesizing means.

* * * * *